United States Patent
Wang et al.

(10) Patent No.: US 10,665,454 B2
(45) Date of Patent: May 26, 2020

(54) LASER ANNEALING APPARATUS AND LASER ANNEALING METHOD FOR SUBSTRATE

(71) Applicants: BOE TECHNOLOGY GROUP CO., LTD., Beijing (CN); Ordos Yuansheng Optoelectronics Co., Ltd., Inner Mongolia (CN)

(72) Inventors: Jingshuai Wang, Beijing (CN); Chul Ho Lee, Beijing (CN); Yongzhi Hao, Beijing (CN); Xiaoqiang Han, Beijing (CN); Zhanpeng Zhang, Beijing (CN); Guimei Zhang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 45 days.

(21) Appl. No.: 15/973,664

(22) Filed: May 8, 2018

(65) Prior Publication Data
US 2019/0057869 A1 Feb. 21, 2019

(30) Foreign Application Priority Data
Aug. 21, 2017 (CN) .......................... 2017 1 0718884

(51) Int. Cl.
*H01L 21/36* (2006.01)
*H01L 21/02* (2006.01)
(Continued)

(52) U.S. Cl.
CPC .... *H01L 21/02683* (2013.01); *B23K 26/0006* (2013.01); *B23K 26/0823* (2013.01);
(Continued)

(58) Field of Classification Search
CPC ......... H01L 21/02683; H01L 21/68785; H01L 27/1285; H01L 2924/00;
(Continued)

(56) References Cited

U.S. PATENT DOCUMENTS

2012/0236896 A1* 9/2012 Takida ............... B23K 26/0853
372/55

FOREIGN PATENT DOCUMENTS

JP H04282869 A 10/1992
JP H06349721 A 12/1994
(Continued)

OTHER PUBLICATIONS

First Office Action for Chinese Patent Application No. 201710718884.8 dated Jun. 14, 2019.

*Primary Examiner* — Robert G Bachner
(74) *Attorney, Agent, or Firm* — Calfee, Halter & Griswold LLP

(57) ABSTRACT

A laser annealing apparatus including a carrying platform with a fixing surface, a laser source and a driving device. The laser source is configured to emit a laser beam toward the fixing surface, the laser beam having an illumination area which covers a center of the fixing surface and extends toward an edge of the fixing surface, in an extending direction of the illumination area the illumination area having a length which is not less than a distance between the center of the fixing surface and the edge of the fixing surface. The driving device is configured to drive the carrying platform to rotate around the center of the fixing surface.

18 Claims, 7 Drawing Sheets

(51) Int. Cl.
  *H01L 21/687*  (2006.01)
  *H01L 27/12*  (2006.01)
  *H01L 21/67*  (2006.01)
  *B23K 26/00*  (2014.01)
  *B23K 26/12*  (2014.01)
  *B23K 26/352*  (2014.01)
  *B23K 26/14*  (2014.01)
  *B23K 26/08*  (2014.01)
  *B23K 101/40*  (2006.01)
  *B23K 103/00*  (2006.01)

(52) U.S. Cl.
  CPC ............ *B23K 26/123* (2013.01); *B23K 26/14* (2013.01); *B23K 26/352* (2015.10); *H01L 21/02532* (2013.01); *H01L 21/02592* (2013.01); *H01L 21/67115* (2013.01); *H01L 21/68764* (2013.01); *H01L 27/1222* (2013.01); *H01L 27/1285* (2013.01); *B23K 2101/40* (2018.08); *B23K 2103/56* (2018.08)

(58) Field of Classification Search
  CPC . H01L 2924/00014; H01L 2924/00012; H01L 2224/05644; H01L 2224/03; H01L 2224/05144; H01L 2224/05155; H01L 2224/05166; H01L 2224/97; H01L 2924/01032; H01L 2924/13091; H01L 2224/94; H01L 21/02532; H01L 2224/83; H01L 2224/9202; H01L 2924/14; B82Y 10/00; B82Y 25/00; B82Y 20/00; G02F 1/136213; G02F 1/1368; G02F 1/13454; G02F 2001/134354; G02F 1/136259; G02F 2001/134345; G02F 1/136227; G02F 1/13624; G02F 2001/13606; G02F 2202/104; G02F 1/133555; G02F 1/1339; G02F 1/134309; G02F 1/134336; G02F 2001/13312; G02F 2001/133354; G02F 2001/13613; G02F 2001/136222; G02F 2001/13625; B81C 2201/0185
  See application file for complete search history.

(56) References Cited

FOREIGN PATENT DOCUMENTS

JP  2004193490 A  *  7/2004
JP  2004193490 A     7/2004

* cited by examiner

LASER ANNEALING APPARATUS AND LASER ANNEALING METHOD FOR SUBSTRATE

CROSS REFERENCE

This application is based upon and claims priority to Chinese Patent Application No. 201710718884.8, filed on Aug. 21, 2017, the entire contents thereof are incorporated herein by reference.

TECHNICAL FIELD

The present disclosure relates to the field of laser annealing technology, and in particular, to a laser annealing apparatus and a laser annealing method for a substrate.

BACKGROUND

At present, low temperature polysilicon (LTPS) has been widely used in the manufacture of display panels. The conventional LTPS technology mainly adopts an excimer laser annealing (ELA) process in which an excimer laser beam is used to illuminate and transform a substrate of amorphous silicon structure into a substrate of polysilicon structure at a high temperature. The polycrystal silicon structure has a more regular arrangement of crystalline grans and a higher mobility of carriers, which helps to improve the reaction speed and driving current of the display panel.

The conventional excimer laser annealing apparatus generally includes a laser source, a carrying platform, etc. A substrate to be annealed is placed on the carrying platform, a laser source is used to emit a laser beam to the substrate, and the laser beam is made to scan various areas of the substrate by controlling linear movement of the carrying platform. In addition, for the same substrate, the platform can be repeatedly moved to allow the same area of the substrate to be repeatedly illuminated multiple times to further optimize the size of the grains.

However, it is difficult to complete the scanning of the entire substrate by one time of linear movement due to limitation of illumination range of the laser beam. Therefore, it is possible to control the platform to move longitudinally to scan part of areas of the substrate, and move laterally to make another area correspond to the laser beam, and then move longitudinally to scan the another area. When the carrying platform moves laterally, the substrate is not within the illumination range of the laser beam and cannot be scanned. Therefore, the time of period for lateral movement belongs to ineffective time which increases the manufacture time for the product. In particular, when the substrate is repeatedly scanned, multiple times of lateral movement will significantly increase the manufacture time.

In should be noted that the information disclosed in this BACKGROUND section is only for an enhanced understanding of the background of the present disclosure, and therefore may contain information which does not constitute the prior art known to those skilled in the art.

SUMMARY

In an aspect of the present disclosure, there is provided a laser annealing apparatus including:

a carrying platform with a fixing surface;

a laser source configured to emit a laser beam toward the fixing surface, the laser beam having an illumination area which covers a center of the fixing surface and extends toward an edge of the fixing surface, in an extending direction of the illumination area the illumination area having a length which is not less than a distance between the center of the fixing surface and the edge of the fixing surface; and a driving device configured to drive the carrying platform to rotate around the center of the fixing surface.

In an exemplary embodiment of the present disclosure, in the extending direction, the length of the illumination area is equal to the distance between the center of the fixing surface and the edge of the fixing surface.

In an exemplary embodiment of the present disclosure, the illumination area is an isosceles triangle area with a vertex thereof coinciding with the center of the fixing surface. Alternatively, the illumination area is a rectangular area with a midpoint of a shorter side thereof coinciding with the center of the fixing surface.

In an exemplary embodiment of the present disclosure, the illumination area further extends from the center of the fixing surface toward an edge in an opposing direction of the extending direction, and in either the extending direction or its opposing direction of the illumination area, the length of the illumination area is equal to the distance between the center of the fixing surface and the edge of the fixing surface.

In an exemplary embodiment of the present disclosure, the illumination area includes two vertically opposite and symmetrical isosceles triangle areas with the vertical vertex of the two isosceles triangle areas coinciding with the center of the fixing surface. Alternatively, the illumination area is a rectangular area with a center thereof coinciding with the center of the fixing surface.

In an exemplary embodiment of the present disclosure, the driving device may drive the carrying platform to rotate through at least six revolutions in the same direction.

In an exemplary embodiment of the present disclosure, the driving device may drive the carrying platform to rotate through at least three revolutions in the same direction.

In another aspect of the present disclosure, there is provided a laser annealing method for a substrate, including:

providing a laser annealing apparatus which includes a carrying platform with a fixing surface, a laser source, and a driving device;

fixing a substrate to be annealed on the fixing surface with a center of the substrate coinciding with a center of the fixing surface, wherein the laser source is configured to emit a laser beam toward the fixing surface, the laser beam of the laser source illuminating the substrate and having an illumination area which covers the center of the substrate and extends toward an edge of the substrate, in an extending direction of the illumination area the illumination area having a length which is not less than a maximum distance between the center of the substrate and the edge of the substrate; and activating the driving device to drive the carrying platform to rotate around the center of the carrying platform in a horizontal plane such that the laser beam scans the whole surface of the substrate.

In an exemplary embodiment of the present disclosure, the substrate is in the shape of rectangle, and in the extending direction, the length of the illumination area is equal to half a length of a diagonal of the substrate.

In an exemplary embodiment of the present disclosure, the illumination area is an isosceles triangle area with a vertex thereof coinciding with the center of the substrate. Alternatively, the illumination area is a rectangular area with a midpoint of a shorter side thereof coinciding with the center of the substrate.

In an exemplary embodiment of the present disclosure, the illumination area further extends from the center of the substrate toward an edge in an opposing direction of the extending direction, and in either the extending direction or its opposing direction of the illumination area, the length of the illumination area is equal to the maximum distance.

In an exemplary embodiment of the present disclosure, the substrate is in the shape of rectangle, and in either the extending direction or its opposing direction, the length of the illumination area is equal to half a length of a diagonal of the substrate.

In an exemplary embodiment of the present disclosure, the illumination area includes two vertically opposite and symmetrical isosceles triangle areas with the vertical vertex of the two isosceles triangle areas coinciding with the center of the substrate. Alternatively, the illumination area is a rectangular area with a center thereof coinciding with the center of the substrate.

In an exemplary embodiment of the present disclosure, the substrate is in the shape of rectangle, and the fixing surface is in the shape of circle with a diameter not less than a length of a diagonal of the substrate.

In an exemplary embodiment of the present disclosure, the time for the driving device to drive the carrying platform to rotate through one revolution is 40-50 seconds.

In an exemplary embodiment of the present disclosure, the driving device may drive the carrying platform to rotate through at least six revolutions in the same direction.

In an exemplary embodiment of the present disclosure, the driving device may drive the carrying platform to rotate through at least three revolutions in the same direction.

It should be appreciated that the foregoing general description and the following detailed description are only exemplary and illustrative, and do not limit the present disclosure.

BRIEF DESCRIPTION OF THE DRAWINGS

Herein the accompany drawings which are incorporated into the specification and constitute part of the specification show embodiment in compliance with the present disclosure. Obviously, the drawings as described in the following only involve some of the embodiments of the present disclosure. Those skilled in the art will obtain, from these drawings, other drawings without creative efforts.

DETAILED DESCRIPTION

Figure 1:
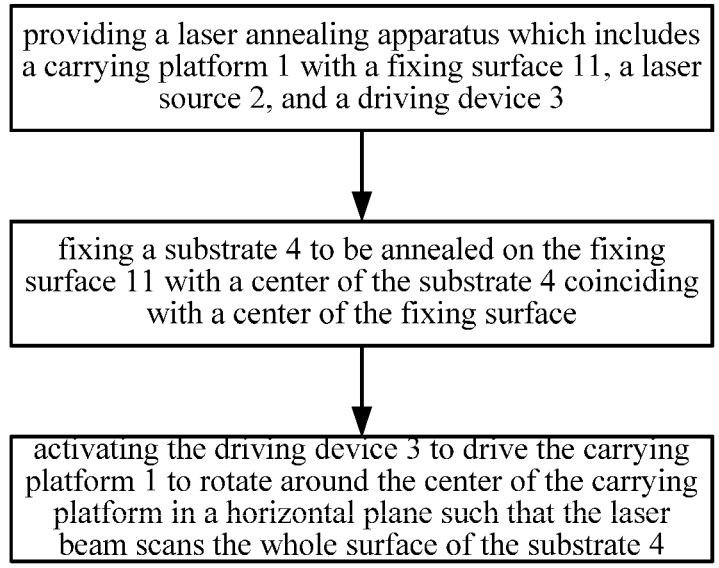
FIG. 1 is a flowchart of a laser annealing method for substrate according to an exemplary embodiment of the present disclosure.

Now exemplary embodiments will be described more fully with reference to the accompanying drawings. However, the example embodiments can be implemented in various ways and shall not be construed as limited to the embodiments set forth herein; rather, these embodiments are provided to make the present disclosure full and complete, and fully convey the concept of the exemplary embodiments to those skilled in the art. Like reference numerals through the drawings denote the same or similar structures, and thus their detailed description will be omitted.

Although relative terms such as "upper" and "lower" are used in the specification to describe the relative relationship of one component with another component as shown in the figures, these terms are used in this specification only for convenience, for example, based on the exemplary directions as shown in the figures. It is to be understood that if the device as shown in the figures is turned upside down, the described "upper" component will become a "lower" component. When a structure is "on" another structure, it may mean that the structure is integrally formed on the another structure, or that the structure is "directly" provided on the another structure, or that the structure is "indirectly" provided on the another structure via still another structure.

The terms "a", "an", "the", and "said" are used to indicate the presence of one or more elements/components/etc. The terms "include", "include" and "have" are used to indicate the meaning including an opening inclusion and indicate that there may be other elements/components/etc. in addition to the listed elements/components/etc. The terms "first", "second", "third", and "fourth" are used as reference only, not as a restriction on the number of their subjects.

In the present disclosure, the substrate may be fixed on the fixing surface of the carrying platform, the laser beam emitted from the laser source may illuminate the substrate, and the driving device controls the carrying platform to rotate the substrate around the center of the substrate in a horizontal plane, thereby scanning the substrate, such that the laser beam can illuminate different areas of the substrate. At the same time, since the illumination area of the laser beam covers the center of the substrate and extends toward the edge, and in the extending direction of the illumination area, the length of the illumination area is not less than the maximum distance from the center to the edge of the substrate, the laser beam can make a complete scan of the substrate only after the platform is rotated through one revolution at the utmost. If multiple scans are required, it suffices only to make the platform to rotate through multiple revolutions. As such, continuous scanning of the substrate can be achieved by rotating the substrate, avoiding lateral movement of the substrate due to change of the illustration area of the laser, eliminating the ineffective time for the lateral movement, thereby helping reduce the manufacture time and improve the manufacture efficiency.

Figure 2:
FIG. 2 is a laser annealing apparatus according to an exemplary embodiment of the present disclosure.

Referring to FIG. 1 and in conjunction with FIG. 2, a laser annealing method for a substrate according to an embodiment of the present disclosure includes:

providing a laser annealing apparatus which includes a carrying platform 1 with a fixing surface 11, a laser source 2, and a driving device 3;

fixing a substrate 4 to be annealed on the fixing surface 11 with a center of the substrate 4 coinciding with a center of the fixing surface, wherein the laser source 2 is configured to emit a laser beam toward the fixing surface, the laser beam of the laser source illuminating the substrate 4 and having an illumination area which covers the center of the substrate 4 and extends toward an edge of the substrate 4, in an extending direction of the illumination area the illumination area having a length which is not less than a maximum distance between the center of the substrate 4 and the edge of the substrate; and activating the driving device 3 to drive the carrying platform 1 to rotate around the center of the carrying platform in a horizontal plane such that the laser beam scans the whole surface of the substrate 4.

The laser annealing method for substrate according to the embodiment of the present disclosure may use with a laser annealing apparatus of the present disclosure. Now a description will be made in conjunction with a laser annealing apparatus according to an embodiment of the present disclosure.

A laser annealing apparatus according to an exemplary embodiment of the present disclosure, as shown in FIGS. 2 to 7, is for annealing a substrate 4 to be annealed. The substrate 4 may be of glass material, and in the shape of rectangle or the like with a center thereof being its geometric center. For example, when the substrate 4 is in the shape of rectangle, its center is the midpoint of the diagonals. When the substrate 4 is in the shape of circle, its center is the center of circle. By laser annealing, the substrate 4 can be transformed into a polycrystalline silicon structure in which the crystalline grains are arranged more regularly, so that the carrier mobility is higher and the reaction speed and driving current of the display panel are improved. The laser annealing apparatus according to the exemplary embodiment may include a carrying platform 1, a laser source 2, and a driving device 3.

The carrying platform 1 may have a fixing surface 11 on which the substrate 4 may be fixed.

The laser source 2 is configured to emit a laser beam toward the substrate 4. The illumination area of the laser beam covers the center of the substrate and extends toward an edge. In the extending direction of the irradiation area, the length of the illumination area is not less than the maximum distance from the center to the edge of the substrate. It should be noted that in the case where the substrate 4 has not yet been fixed on the fixing surface 11 of the carrying platform 1, the laser beam emitted from the laser source 2 illuminates the fixing surface 11. In the case where the substrate 4 has been fixed on the fixing surface 11 of the carrying platform 1 with the center of the substrate 4 coinciding with the center of the carrying platform 1, the position where the laser impinges on the fixing surface 11 and the position where the laser impinges on the substrate 4 are substantially the same in the language description. Now, take an example of the substrate being fixed on the fixing surface 11 for illustration.

The driving device 3 may drive the carrying platform 1 to rotate around the center of the substrate 4, i.e., the center of the carrying platform 1, in a horizontal plane.

The laser annealing apparatus according to the exemplary embodiment can allow the laser beam to illuminate different areas of the substrate by rotating the substrate 4 with the carrying platform 1. The laser beam can make a complete scan of the substrate only after the platform is rotated through one revolution at the utmost. If multiple scans are required, it suffices only to make the platform to rotate through multiple revolutions. As such, lateral movement of the substrate can be avoided in order to change illustration areas of the laser, the ineffective time for the lateral movement can be eliminated, thereby helping reduce the manufacture time and improve the manufacture efficiency.

Further description for the components of the laser annealing apparatus according to the exemplary embodiment will be made below.

Figure 3:
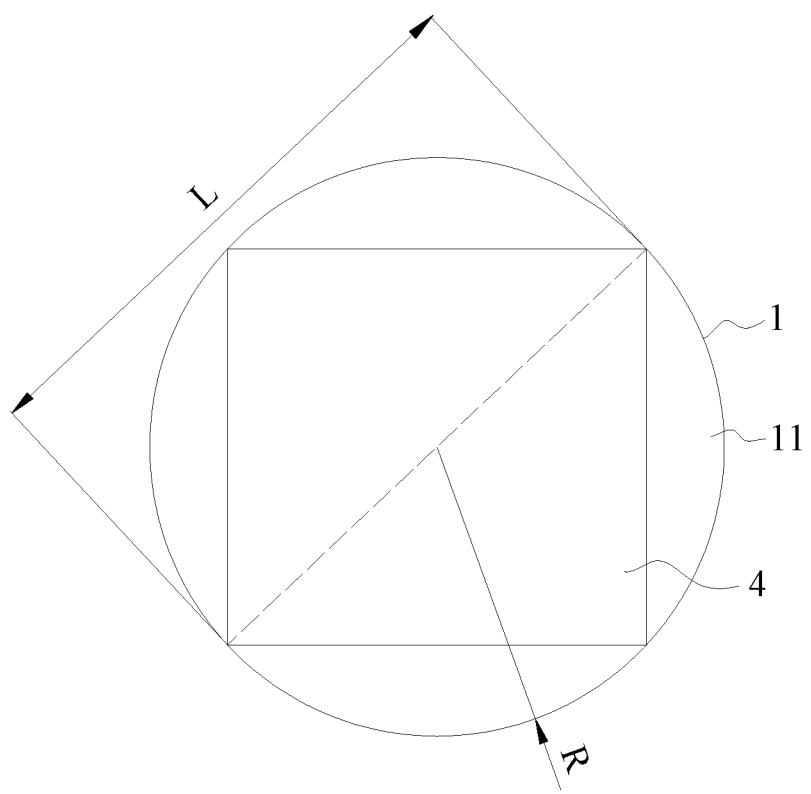
FIG. 3 is a top view of the carrying platform and the substrate in FIG. 2.

In the present exemplary embodiment, as shown in FIGS. 2 and 3, the carrying platform 1 may be of a horizontally arranged plate-like structure, and in the shape of circle, rectangle and the like. The carrying platform 1 may have an upper surface which may be a fixing surface 11 provided thereon with a fixing device for fixing the substrate 4. The fixing device may be a suction cup, a claw or other device. There is no specific limitation to concrete structure of the fixing device, as long as it can fix the substrate 4 on the fixing surface 11. Of course, the substrate 4 may be directly placed on the fixing surface 11, without a fixing device, as long as it can rotate with the carrying platform 1.

The fixing surface 11 may have a size not less than that of the substrate 4 such that the edges of the substrate 4 do not exceed the range of the fixing surface 11. As shown in FIG. 3, if the fixing surface 11 is in the shape of circle and the substrate 4 is in the shape of rectangle, the diameter of the fixing surface 11 may be equal to the length L of the diagonal of the substrate 4, that is, the radius R of the fixing surface 11 is equal to half of the length L of the diagonal of the substrate 4, and the center of the substrate 4 may exactly correspond to the center of circle of the fixing surface 11. Then, the edges of the substrate 4 do not exceed the range of the fixing surface 11. Of course, the diameter of the fixing surface 11 may also be greater than the length L of the diagonal of the substrate 4.

In the present exemplary embodiment, as shown in FIG. 2, the laser source 2 may be positioned above the carrying platform 1, and emit a laser beam toward and illuminate the substrate 4. The laser source 2 may be an excimer laser, which may include a laser emitting assembly, an optical system, an air supply assembly, etc. The optical system may adjust the optical path of the laser emitted from the laser emitting assembly so as to allow the laser to illuminate the substrate 4. The air supply assembly may supply an inert gas to the surface of the substrate 4 to prevent the substrate 4 from being oxidized. For details, reference may be made to the existing excimer laser generator, which will not be described in detail herein. Of course, in other exemplary embodiments of the present disclosure, the laser source 2 may alternatively be other laser generating devices having the same function, which will not be enumerated here.

It should be noted that since the process of laterally moving the substrate 4 is eliminated, the disturbance to the gas occurred when the direction of movement of the substrate 4 is switched can be avoided, which helps ensure the stability of the gas flow output by the gas supply assembly.

Figure 4:
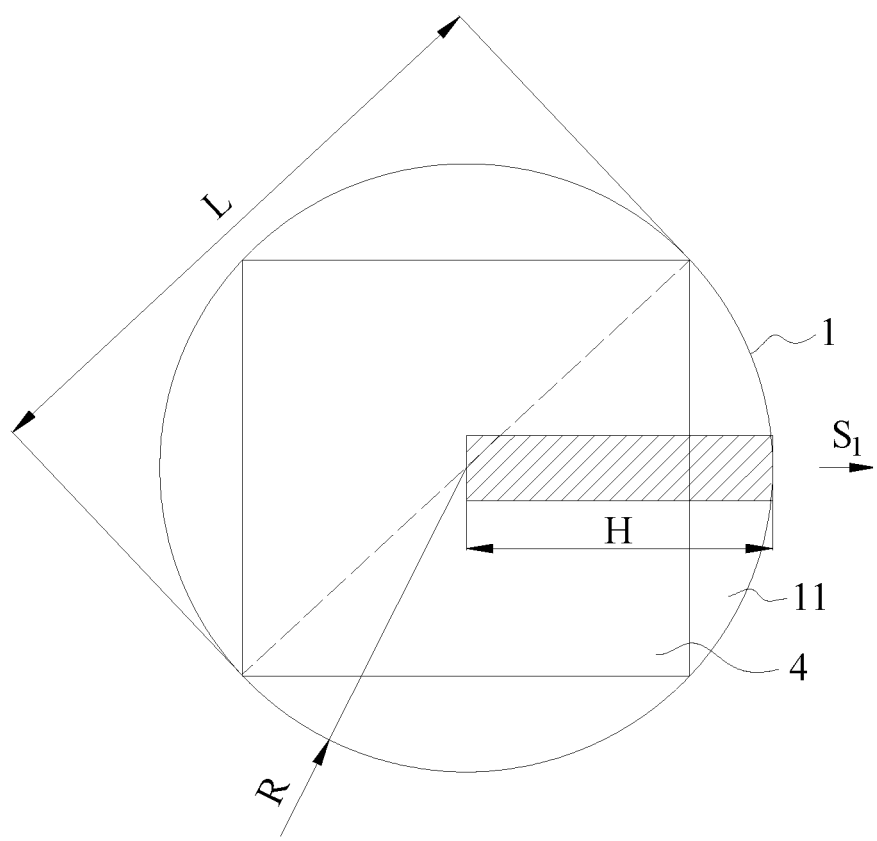
FIG. 4 is a schematic view of a first configuration of the illumination area on the substrate of the laser source in FIG. 2.

As shown in FIGS. 4 to 7, the illumination area of the laser beam covers the center of the substrate 4 and extends toward the edges of the substrate 4. In an extending direction of the illumination area, the length of the illumination area is not less than the maximum distance from the center of the substrate to an edge of the substrate. The hatched areas shown in FIGS. 4 to 7 are the illumination area, and the dashed lines indicate the diagonal line of the substrate 4, the direction marked by S1 is the extending direction of the irradiation area, and the direction marked by S2 is the opposing direction of the extending direction. The illumination area may take many forms, for example:

In the first form, as shown in FIG. 4, the shapes of the substrate 4 and the illumination area are both a rectangle, the extending direction S1 of the illumination area is the longitudinal direction of the rectangle, and the length H of the illumination area is equal to half the length L of the diagonal of the substrate 4. The midpoint of a shorter side of the illumination region coincides with the center of the substrate 4 so as to cover the center of the substrate 4. And the illumination area extends from the center of the substrate 4 toward the edge of the substrate 4. Thus, when the substrate 4 has been rotated through a revolution, that is, rotated through 360°, the illumination area can scan the entire surface of the substrate 4, and make a complete scan of the substrate 4.

Figure 5:
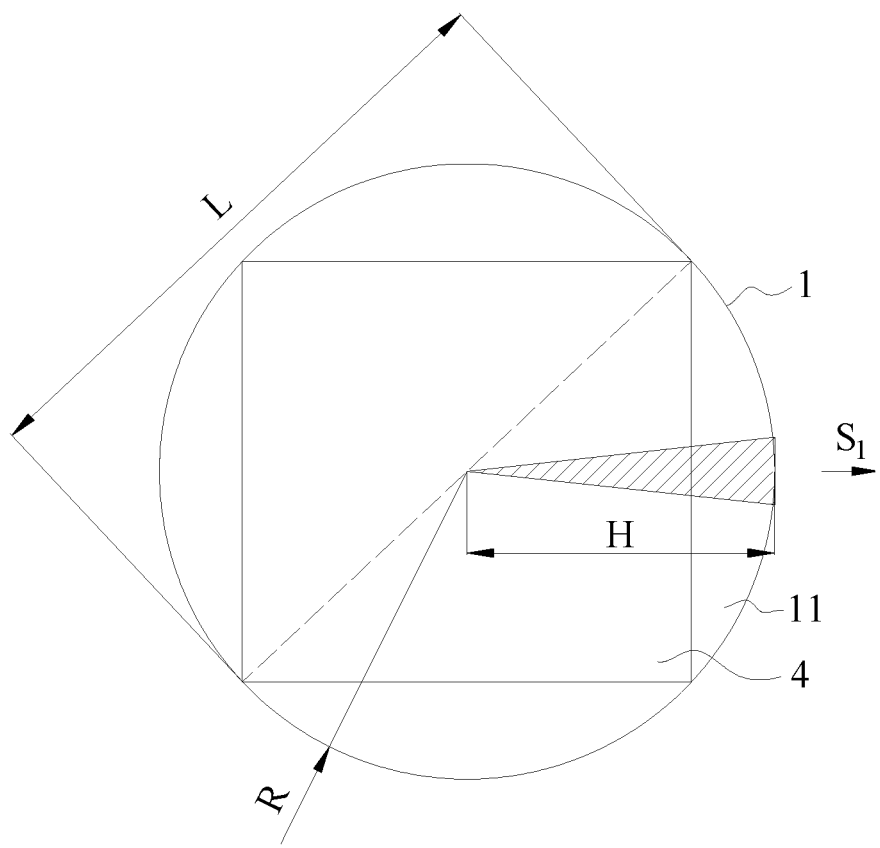
FIG. 5 is a schematic view of a second configuration of the illumination area on the substrate of the laser source in FIG. 2.

In the second form, as shown in FIG. 5, the substrate 4 has a rectangular shape, and the illumination area is an isosceles triangular area with its apex coinciding with the center of the substrate 4. The isosceles triangle area extends in the extending direction S1 from the center of the substrate 4 toward an edge of the substrate 4. The altitude of the base of the isosceles triangle is of the length H of the illumination area, which may be equal to half the length L of the diagonal of the substrate 4. Thus, when the substrate 4 has been rotated through a revolution, that is, by 360°, the illumination area can similarly scan the entire surface of the substrate 4, and make a complete scan of the substrate 4.

Figure 6:
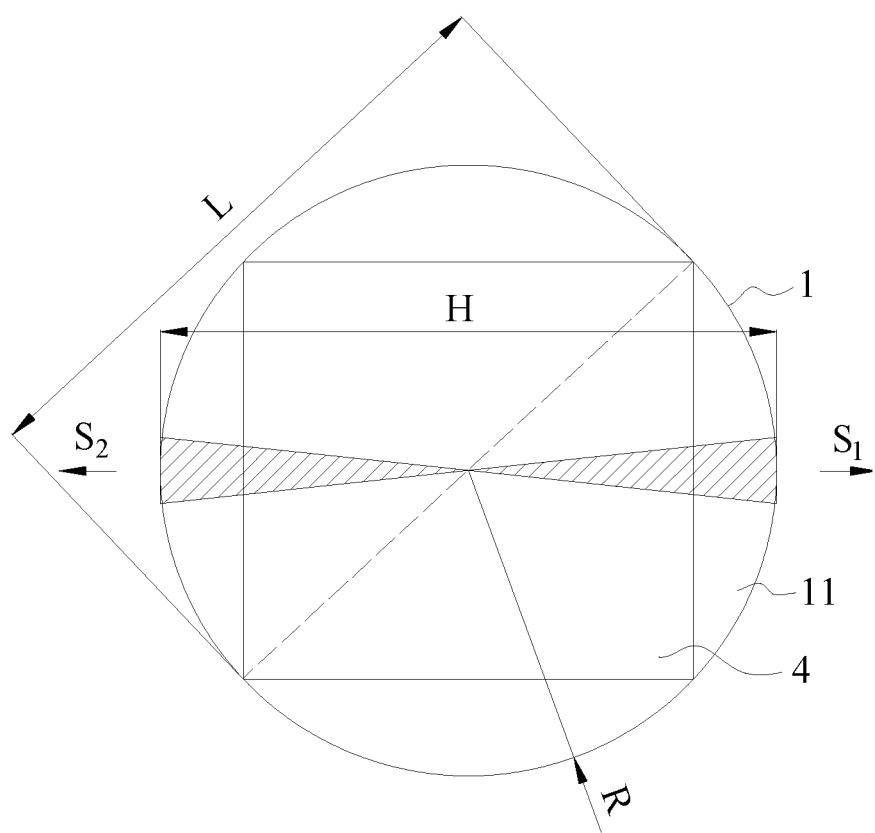
FIG. 6 is a schematic view of a third configuration of the illumination area on the substrate of the laser source in FIG. 2.

In the third form, as shown in FIG. 6, the substrate 4 has a rectangular shape, and the illumination area covers the center of the substrate 4, and extends in both an extending direction S1 and an its opposing direction S2 from the center of the substrate 4 toward its edges. The illumination area may include two vertically opposite isosceles triangular areas which are arranged symmetrically with respect to the vertical apex, and the vertical apex of the two isosceles triangular areas coincides with the center of the substrate 4.

In the extending direction S1 of the illumination area, the length of the illumination area is the altitude of the base of an isosceles triangle, which may be equal to half the length L of the diagonal of the substrate 4. In the opposing direction S2 of the extending direction of the illumination area, the length of the illumination area is the altitude of the base of another isosceles triangle, which may also be equal to half the length L of the diagonal of the substrate 4. Thus, the total length H of the illumination area is the sum of the altitudes of the bases of the two isosceles triangles, which is equal to the diagonal length L of the substrate 4. Thus, when the substrate 4 has been rotated through half a revolution, that is, by 180°, the illumination area can scan the entire surface of the substrate 4, and make a complete scan of the substrate 4.

Figure 7:
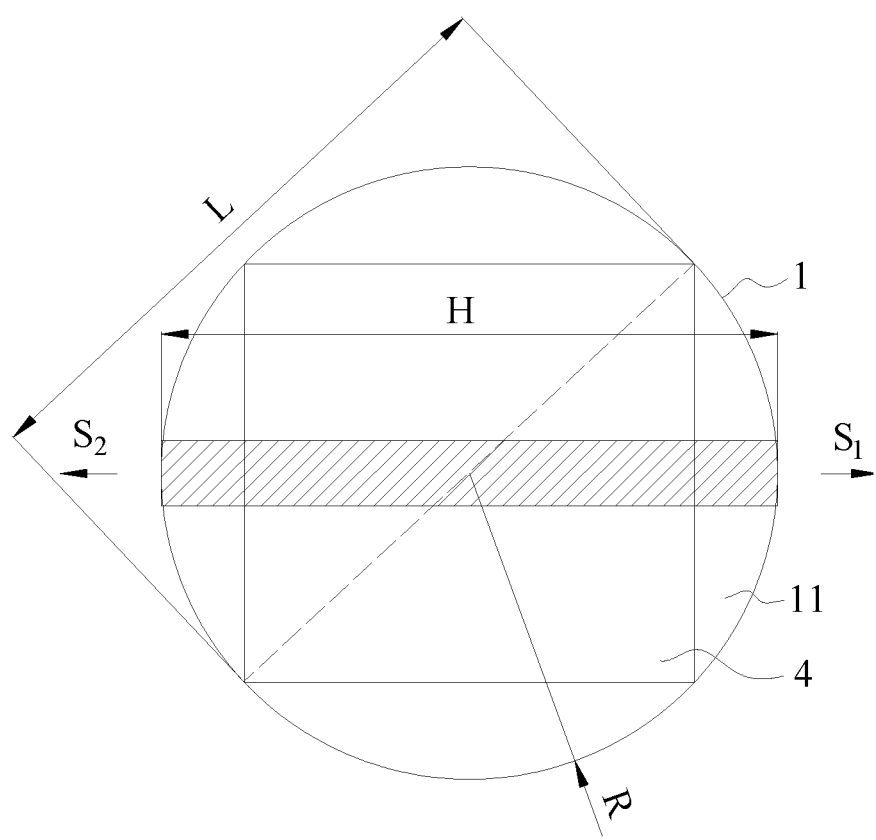
FIG. 7 is a schematic view of a fourth configuration of the illumination area on the substrate of the laser source in FIG. 2.

In the fourth form, as shown in FIG. 7, both the substrate 4 and the illumination area have a rectangular shape, and the illumination area covers the center of the substrate 4, and extends in both an extending direction S1 and an its opposing direction S2 from the center of the substrate 4 toward its edges. In the extending direction S1 of the illumination area, the length of the illumination area may be equal to half the diagonal length L of the substrate 4. In the opposing direction S2 of the extending direction of the illumination area, the length of the illumination area may also be equal to half the diagonal length L of the substrate 4. Thus, when the substrate 4 has been rotated through half a revolution, that is, by 180°, the illumination area can similarly scan the entire surface of the substrate 4, and make a complete scan of the substrate 4.

It should be noted that the various forms of the aforesaid illumination area are only exemplary, and do not constitute a limitation to its shape and length. In other exemplary embodiments of the present disclosure, the length H of the illumination area may alternatively be other ones, as long as they are not less than half the diagonal length L of the substrate 4. The illumination area may also have other shapes, which will not be enumerated here.

Figure 8:
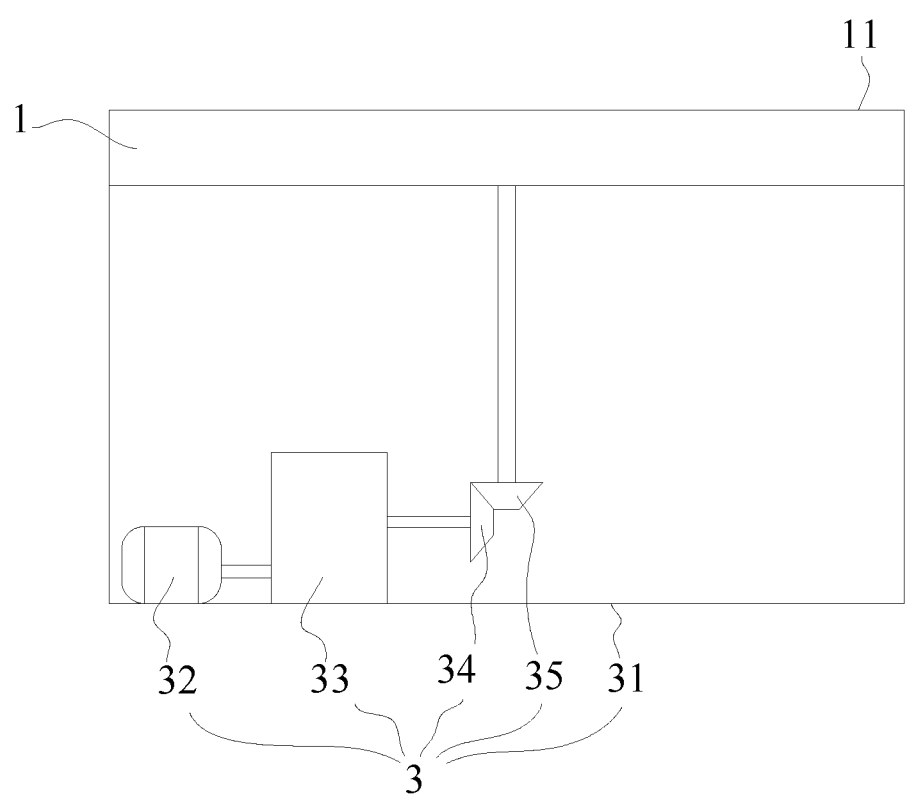
FIG. 8 is a schematic view of the principle of the driving device driving the carrying platform in the FIG. 2.

In the present exemplary embodiment, as shown in FIG. 8, the driving device 3 may include a housing 31, a motor 32, a speed reducer 33, a controller (not shown in the figure), and a transmission device, in which:

The housing 31 can be directly placed on the ground, or it can be fixedly connected to the ground by means of connecting members such as anchor screws. There is not a specific limitation to the shape and size of the housing 31. The aforesaid carrying platform 1 may be horizontally provided on the top of the housing 31, and rotate relative to the housing 31.

The motor 32 may be provided within the housing 31, and have an output shaft. There is not a specific limitation to the type of the motor 32, as long as it can output rotation and the rotation speed and direction can be controlled.

The speed reducer 32 may be provided within the housing 31, and have an input end and an output end. The output end may be connected with the output shaft of the motor 32. There is not a specific limitation to the type of the speed reducer.

The transmission assembly has an end connected with the output end of the speed reducer 33, and another end connected with the carrying platform 1, such that the carrying platform 1 can be driven to rotate through the motor 32. For example, the transmission assembly may include a first bevel gear 34 and a second bevel gear 35 engaged with each other, each of which has an axially extending axle. The axle of the first bevel gear 34 is horizontally arranged and connected with the output end of the reducer 33. The axle shaft of the second bevel gear 3 is vertically arranged and connected with the carrying platform 1. As such, the transmission can be performed through the first bevel gear 34 and the second bevel gear 35. Of course, the transmission assembly may alternatively adopt other structures, which will not be enumerated herein, as long as the rotation output by the motor 32 through the speed reducer 33 can be transmitted to the carrying platform 1.

The controller may be connected with the motor 32. The controller may be a microprocessor such as a single chip microcomputer or other devices such as a computer including a microprocessor. The activation and stop of the motor 32 can be controlled by the controller, and/or the speed and direction of the motor 32 can also be controlled by the controller.

The driving device 3 can drive the carrying platform 1 to uniformly rotate with a clockwise or counterclockwise rotation direction. The time for the carrying platform 1 to be rotated through a revolution may be 40-50 seconds, for example, but not limited thereto, 40 seconds, 45 seconds, or 50 seconds. The time may be less than 40 seconds or larger than 50 seconds.

The driving device 3 can drive the carrying platform 1 to rotate through a predetermined number of revolutions in order to make multiple complete scans on the substrate 4 such that the substrate 4 has crystalline grains of optimized size and reduced roughness of the surface of the substrate 4. The predetermined number of revolutions may depend on the form of the illumination area, for example:

In a case where the length H of the illumination area is equal to half the diagonal length L of the substrate 4, for example, the illumination area is in the first form, the second form, or other similar forms as described above, the driving device 3 may drive the carrying platform 1 to rotate through at least six revolutions in the same direction such that at least six times of complete scans can be made on the substrate 4, and the every same area on the substrate 4 may be illuminated with the laser at least six times. Of course, the number of revolutions of the platform 1 may alternatively be larger or smaller.

In a case where the length H of the illumination area is equal to the diagonal length L of the substrate 4, for example, the illumination area is in the third form, the fourth form, or other similar forms as described above, the driving device 3 may drive the carrying platform 1 to rotate through at least three revolutions in the same direction such that at least six times of complete scans can be made on the substrate 4. Of course, the number of revolutions of the platform 1 may alternatively be larger or smaller.

Those skilled in the art will readily envisage other embodiments of the present disclosure by considering the specification and practicing the invention disclosed herein. The present disclosure is intended to encompass any modification, usage or adaptive variation of the present disclosure, which follows the general principle of the present disclosure and may include common knowledge or customary technical means in the art not disclosed in the present disclosure. The true scope of the present disclosure and spirit is defined by the appended claims.

What is claimed is:

1. A laser annealing apparatus comprising:
   a carrying platform with a fixing surface;
   a laser source configured to emit a laser beam toward the fixing surface, the laser beam having an illumination area which covers a center of the fixing surface and extends toward an edge of the fixing surface, in an extending direction of the illumination area the illumination area having a length which is not less than a distance between the center of the fixing surface and the edge of the fixing surface; and
   a driving device configured to drive the carrying platform to rotate around the center of the fixing surface,
   wherein the illumination area further extends from the center of the fixing surface toward an edge in an opposing direction of the extending direction, and in either the extending direction or the opposing direction of the illumination area, the length of the illumination area is equal to the distance between the center of the fixing surface and the edge of the fixing surface.

2. The laser annealing apparatus according to claim 1, wherein in the extending direction, the length of the illumination area is equal to the distance between the center of the fixing surface and the edge of the fixing surface.

3. The laser annealing apparatus according to claim 2, wherein the illumination area is an isosceles triangle area with a vertex thereof coinciding with the center of the fixing surface, or
   wherein the illumination area is a rectangular area with a midpoint of a shorter side thereof coinciding with the center of the fixing surface.

4. The laser annealing apparatus according to claim 2, wherein the illumination area comprises two vertically opposite and symmetrical isosceles triangle areas with the vertical vertex of the two isosceles triangle areas coinciding with the center of the fixing surface, or
   wherein the illumination area is a rectangular area with a center thereof coinciding with the center of the fixing surface.

5. The laser annealing apparatus according to claim 2, wherein the driving device is configured to drive the carrying platform to rotate through at least six revolutions in the same direction.

6. The laser annealing apparatus according to claim 2, wherein the driving device is configured to drive the carrying platform to rotate through at least three revolutions in the same direction.

7. A laser annealing method for substrate, comprising:
   providing a laser annealing apparatus which comprises a carrying platform with a fixing surface, a laser source, and a driving device;
   fixing a substrate to be annealed on the fixing surface with a center of the substrate coinciding with a center of the fixing surface, wherein the laser source is configured to emit a laser beam toward the fixing surface, the laser beam of the laser source illuminating the substrate and having an illumination area which covers the center of the substrate and extends toward an edge of the substrate, in an extending direction of the illumination area the illumination area having a length which is not less than a maximum distance between the center of the substrate and the edge of the substrate; and
   activating the driving device to drive the carrying platform to rotate around the center of the carrying platform in a horizontal plane such that the laser beam scans the whole surface of the substrate,
   wherein the illumination area further extends from the center of the substrate toward an edge in an opposing direction of the extending direction, and in either the extending direction or the opposing direction of the illumination area, the length of the illumination area is equal to the maximum distance.

8. The laser annealing method according to claim 7, wherein the substrate is in the shape of rectangle, and in the extending direction, the length of the illumination area is equal to half a length of a diagonal of the substrate.

9. The laser annealing method according to claim 8, wherein the illumination area is an isosceles triangle area with a vertex thereof coinciding with the center of the substrate, or
   wherein the illumination area is a rectangular area with a midpoint of a shorter side thereof coinciding with the center of the substrate.

10. The laser annealing method according to claim 7, wherein the substrate is in the shape of rectangle, and in either the extending direction or the opposing direction, the length of the illumination area is equal to half a length of a diagonal of the substrate.

11. The laser annealing method according to claim 7, wherein the illumination area comprises two vertically opposite and symmetrical isosceles triangle areas with the vertical vertex of the two isosceles triangle areas coinciding with the center of the substrate, or
    wherein the illumination area is a rectangular area with a center thereof coinciding with the center of the substrate.

12. The laser annealing method according to claim 7, wherein the substrate is in the shape of rectangle, and the fixing surface is in the shape of circle with a diameter not less than a length of a diagonal of the substrate.

13. The laser annealing method according to claim 8, wherein the substrate is in the shape of rectangle, and the fixing surface is in the shape of circle with a diameter not less than the length of the diagonal of the substrate.

14. The laser annealing method according to claim 7, wherein the time for the driving device to drive the carrying platform to rotate through one revolution is 40-50 seconds.

15. The laser annealing method according to claim 8, wherein the driving device is configured to drive the carrying platform to rotate through at least six revolutions in the same direction.

16. The laser annealing method according to claim 9, wherein the driving device is configured to drive the carrying platform to rotate through at least six revolutions in the same direction.

17. The laser annealing method according to claim 7, wherein the driving device is configured to drive the carrying platform to rotate through at least three revolutions in the same direction.

18. The laser annealing method according to claim 10, wherein the driving device is configured to drive the carrying platform to rotate through at least three revolutions in the same direction.

* * * * *